(12) United States Patent
Zhang et al.

(10) Patent No.: US 7,216,049 B2
(45) Date of Patent: May 8, 2007

(54) METHOD FOR CALIBRATING CURRENT OFFSET AND FILTERING BAD DATA IN A SYSTEM THAT DETECTS POWER OUTPUT

(75) Inventors: Zheng Zhang, St. Joseph, MI (US); Huangsheng Xu, Coloma, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 0 days.

(21) Appl. No.: 10/874,529

(22) Filed: Jun. 23, 2004

(65) Prior Publication Data
US 2005/0288885 A1    Dec. 29, 2005

(51) Int. Cl.
*G01R 35/00* (2006.01)
(52) U.S. Cl. ...................................... 702/107
(58) Field of Classification Search ................ 702/85, 702/105, 107; 318/636, 638
See application file for complete search history.

(56) References Cited

U.S. PATENT DOCUMENTS

| 5,457,375 | A | * | 10/1995 | Marcinkiewicz et al. ... 318/802 |
| 5,495,384 | A | * | 2/1996 | Wallis et al. ................. 361/64 |
| 5,619,114 | A | * | 4/1997 | Blasko ........................ 318/812 |
| 5,780,989 | A | * | 7/1998 | Matsumoto .................. 318/632 |
| 6,393,918 | B2 | | 5/2002 | French et al. |
| 6,426,602 | B1 | * | 7/2002 | McCann et al. ............. 318/432 |
| 6,442,979 | B1 | | 9/2002 | Thorn et al. |
| 6,715,175 | B2 | | 4/2004 | Ciancimino et al. |
| 2001/0052265 | A1 | | 12/2001 | French et al. |
| 2004/0097915 | A1 | * | 5/2004 | Refior et al. ................. 606/34 |

FOREIGN PATENT DOCUMENTS

| EP | 507138 A1 | 7/1992 |
| EP | 0792963 | 9/1997 |
| EP | 0903845 | 3/1999 |
| JP | 02017892 | 1/1990 |
| JP | 2004112959 | 4/2004 |

* cited by examiner

*Primary Examiner*—John Barlow
*Assistant Examiner*—Demetrius Pretlow
(74) *Attorney, Agent, or Firm*—Robert O. Rice; Stephen Krefman; John F. Colligan

(57) ABSTRACT

One embodiment is a method of calibrating current offsets from a direct current bus current circuit adapted to control a motor including the steps of initializing the direct current bus current circuit, disengaging pulse width modulated signals to the motor, sampling current values at a predetermined sampling rate, averaging the current values over a predetermined number of samples to establish an offset value, and calculating a calibration value that will nullify the offset value in any subsequent processing of current samples. Another embodiment, a method of filtering inaccurate data from a sequential calculation of power values based on repeatedly sampled voltage and current including the steps of establishing a moving window of a predetermined number of power values, calculating an average power over a sequence comprising the predetermined number of power values, calculating an error value for each time, and comparing each error value to a preset value.

10 Claims, 14 Drawing Sheets

METHOD FOR CALIBRATING CURRENT OFFSET AND FILTERING BAD DATA IN A SYSTEM THAT DETECTS POWER OUTPUT

FIELD OF THE INVENTION

The present invention relates to a method for calibrating current offsets and filtering bad data in a system that detects power output. The invention has applicability in an electrically motor-driven appliance that has a controller or a processor that utilizes power output for further purposes, such as detecting and correcting an unbalanced condition in a washing machine.

DESCRIPTION OF THE RELATED ART

Washing machines utilize a generally cylindrical perforated basket for holding clothing and other articles to be washed that is rotatably mounted within an imperforate tub mounted for containing the wash liquid, which generally comprises water, detergent or soap, and perhaps other constituents. In some machines the basket rotates independently of the tub and in other machines the basket and tub both rotate. In this invention, the rotatable structure is referred to generically as a "drum", including the basket alone, or the basket and tub, or any other structure that holds and rotates the clothing load. Typically, an electric motor drives the drum. Various wash cycles introduce into the clothing and extract from the clothing the wash liquid, usually ending with one or more spin cycles where final rinse water is extracted from the clothes by spinning the drum.

It is common to categorize washing machines by the orientation of the basket. Vertical-axis washing machines have the basket situated to spin about a vertical axis relative to gravity. Horizontal-axis washing machines have the basket oriented to spin about an essentially horizontal axis, relative to gravity.

Both vertical and horizontal-axis washing machines extract water from clothes by spinning the drum about their respective axes, such that centrifugal force extracts water from the clothes. Spin speeds are typically high in order to extract the maximum amount of water from the clothes in the shortest possible time, thus saving time and energy. But when clothing and water are not evenly distributed about the axis of the drum, an imbalance condition occurs. Typical spin speeds in a vertical axis washer are 600–700 RPM, and in a horizontal axis washer at 1100 or 1200 RPM. Moreover, demand for greater load capacity fuels a demand for larger drums. Higher spin speeds coupled with larger capacity drums aggravates imbalance problems in washing machines, especially in horizontal axis washers. Imbalance conditions become harder to accurately detect and correct.

As the washing machine drum spins about its axis, there are generally two types of imbalances that it may exhibit: static imbalance and dynamic imbalance. FIGS. 1–4 illustrate schematically different configurations of imbalance in a horizontal axis washer comprising a drum 10 having a horizontal geometric axis 12. The drum 10 is suspended for rotation within a cabinet 14 having a front 16 (where access to the interior of the drum is normally provided) and a back 18. A drive point 19 (usually a motor shaft) is typically located at the back 18.

FIGS. 1(a) and (b) show a static imbalance condition generated by a static off-balance load. Imagine a load 20 on one side of the drum 10, but centered between the front 16 and the back 18. A net moment torque t causes the geometric axis 12 to rotate about the axis of rotation 22 of the combined mass of the drum 10 and the load 20, resulting in displacement d of the drum 10. This displacement, if minor, is often perceived as a vibration at higher speeds. The suspension system is designed to handle such vibration under normal conditions. Static imbalances are detectable at relatively slow speeds such as 85 or 90 RPM.

Dynamic imbalance is more complex and may occur independently of the existence of any static imbalance. FIGS. 2–4 illustrate several different conditions where dynamic imbalances exist. In FIGS. 2(a) and (b), imagine a dynamic off balance load of two identical masses 30, one on one side of the drum 10 near the front 16 and the other near the back 18. In other words, the masses 30 are on a line 32 skewed relative to the geometric axis 12. The net moment torque $t_1$ about the geometric axis 12 is zero, so there is no static imbalance. However, there is a net moment torque $t_2$ along the geometric axis 12, so that the drum will tend to wobble about some axis other than the geometric axis. If the moment is high enough, the wobble can be unacceptable.

FIGS. 3(a) and (b) illustrates a combined static and dynamic imbalance caused by a front off-balance load. Imagine a single load 40 in the drum 10 toward the front 16. There is a net moment torque $t_1$ about the geometric axis 12, resulting in a static imbalance. There is also a moment torque $t_2$ along the geometric axis 12, resulting in a dynamic imbalance. The resulting motion of the drum is a combination of displacement and wobble.

FIGS. 4(a) and (b) illustrates a combined static and dynamic imbalance caused by a back off-balance load. Imagine a single load 50 in the drum 10 toward the back 18. There is a net moment torque $t_1$ about the geometric axis 12, resulting in a static imbalance. There is also a moment torque $t_2$ along the geometric axis 12, resulting in a dynamic imbalance. The resulting motion of the drum is a combination of displacement and wobble.

Unfortunately, dynamic imbalance is often detectable only at higher speeds. Both vertical and horizontal axis machines exhibit static imbalances, but dynamic imbalances are a greater problem in horizontal-axis machines. Imbalance-caused vibrations result in greater power consumption by the drive motor, excessive noise, and decreased performance.

Many solutions have been advanced for detecting and correcting both static and dynamic imbalances. Correction is generally limited to aborting the spin, reducing the spin speed, or changing the loads in or on the basket. Detection presents the more difficult problem. It is known to detect vibration directly by employing switches, such as mercury or micro-switches, which are engaged when excessive vibrations are encountered. Activation of these switches is relayed to a controller for altering the operational state of the machine. It is also known to use electrical signals from load cells on the bearing mounts of the basket, which are sent to the controller. Other known methods sample speed variations during the spin cycle and relate it to power consumption. For example, it is known to have a controller send a PWM (Pulse Width Modulated) signal to the motor controller for the drum, and measure a feedback signal for RPM achieved at each revolution of the drum. Fluctuations in the PWM signal correspond to drum imbalance, at any given RPM. Yet other methods measure power or torque fluctuations by sensing current changes in the drive motor. Solutions for detecting static imbalances by measuring torque fluctuations in the motor abound. But there is no correlation between static imbalance conditions and dynamic imbalance conditions; applying a static imbalance algorithm to torque fluctuations will not accurately detect a dynamic imbalance.

For example, an imbalance condition caused by a front off balance load (see FIG. 3) will be underestimated by existing systems for measuring static imbalances. Conversely, an imbalance condition caused by a back off balance load (see FIG. 4) will be overestimated by existing systems for measuring static imbalances.

Moreover, speed, torque and current in the motor can all fluctuate for reasons unrelated to drum imbalance. Commonly owned U.S. Pat. No. 6,640,372 presents a solution to factoring out conditions unrelated to drum imbalance by establishing a stepped speed profile where average motor current is measured at each step and an algorithm is applied to predetermined thresholds for ascertaining an unbalanced state of the drum. Corrective action by the controller will reduce spin speed to minimize vibration. The particular algorithm in the '372 patent may be accurate for ascertaining static imbalances. However, is not entirely accurate for horizontal axis washing machines because it does not accurately ascertain the various dynamic imbalance conditions.

There is yet another unacceptable condition of a rotating washer drum that involves neither a static or dynamic imbalance, but establishes a point distribution that can deform the drum. A point distribution condition is illustrated in FIGS. 5(a) and (b). Imagine two identical loads 60 distributed evenly about the geometric axis 12, and on a line 52 normal to the geometric axis. There is no moment torque, either about the geometric axis 12, or along the geometric axis. Thus, there is no imbalance detectable at any speed. However, centrifugal force $f$ acting on the loads 60 will tend to deform the drum. If the drum were a basket rotating inside a fixed tub as is common in many horizontal axis washers, the basket may deform sufficiently to touch the tub, degrading performance and causing unnecessary wear and noise.

Another problem in reliably detecting imbalances in production horizontal axis washers is presented by the fact that motors, controllers, and signal noise vary considerably from unit to unit. Thus, for example, a change in motor torque in one unit may be an accurate correlation to a given imbalance condition in that unit, but the same change in torque in another unit may not be an accurate correlation for the same imbalance condition. In fact, the problems of variance among units and signal noise are common to any appliance where power measurements are based on signals that are taken from electronic components and processed for further use.

There exists a need in the art for an imbalance detection system for a washing machine, particularly horizontal axis washing machines, which can effectively, efficiently, reliably and accurately sense any imbalance condition, and sense other obstructions that may adversely affect performance. Further, there is a need for accurately determining stable and robust power information that can accommodate variations in motors, controllers and signal noise from unit to unit.

SUMMARY OF THE INVENTION

These problems and others are solved by the present invention of a method of calibrating current offsets from a direct current bus circuit used by a controller to control a motor. The method comprises the steps of initializing the direct current bus circuit, disengaging pulse width modulated signals to the motor, sampling current values at a predetermined sampling rate, averaging the current values over a predetermined number of samples to establish an offset value, and calculating a calibration value. The controller uses the calibration value to nullify the offset value while processing of current samples to control the motor.

Preferably, the sampling rate is in a range of 20–50 KHz. Also, preferably, the predetermined number of samples is in a range of about 200–512. The default number can be set at 512.

In another aspect of the invention, there is provided a method of filtering inaccurate data from a sequential calculation of power values by a controller based on repeatedly sampled voltage and current of a motor obtained at a predetermined sampling rate. The method includes the steps of establishing a moving window of a predetermined number of power values that moves to include the power value based on the last sample of voltage and current, calculating an average power over a sequence comprising the predetermined number of power values at three different times within the window, calculating an error value for each time, based on the difference between two of the average power values, and comparing each error value to a preset value. In this manner, when the error value exceeds the preset value, the power value based on the last sample is discarded and not used by the controller to control the motor.

Preferably, the predetermined sampling rate is in a range of 20–50 KHz. Also, the predetermined number of power values is ideally about 256. In either case, the controller employing the methods can be used with the motor in a washing machine.

DETAILED DESCRIPTION

Imbalance Detection

Figure 6:
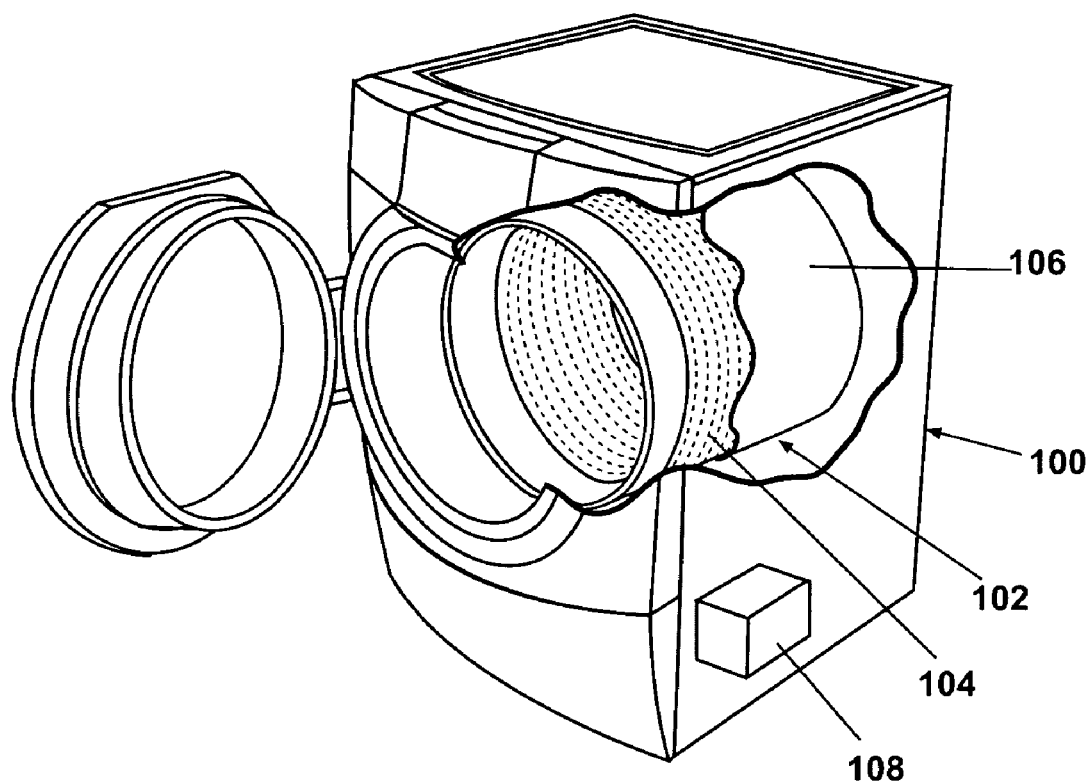
FIG. 6 is a perspective view of a horizontal axis washing machine where the invention can be applied.

FIG. 6 shows a front load, horizontal axis washing machine 100 of the type most suited for the present invention. But for incorporating the method according to the invention in the washing machine 100, the physical structure is conventional. Internally, the washing machine 100 has a drum 102 comprising a rotating perforated basket 104, nested within an imperforate tub 106 that holds wash liquid during the various cycles of a washing process. It will be understood that the term "drum" refers to the rotatable structure that holds the clothing and wash liquid, whether that structure is the basket 104 alone or both the basket 104 and tub 106, or any other equivalent structure. A variable speed motor 108 typically drives the drum 102 with pulleys through either a direct drive system or a belt. The tub 106 is typically supported by a suspension system (not shown) that can include springs, dampers, and the like.

Figure 1A:
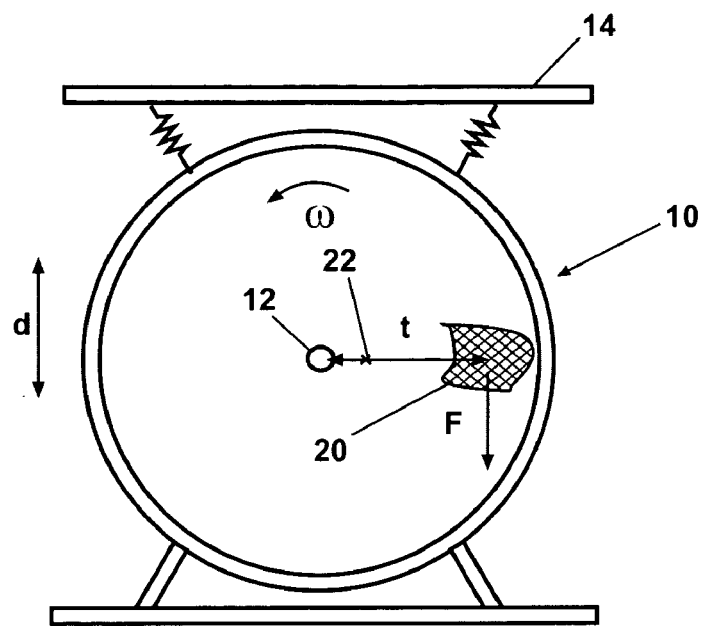
FIGS. 1(a) and (b) is a schematic illustration of the concept of static imbalance.
Figure 1B:
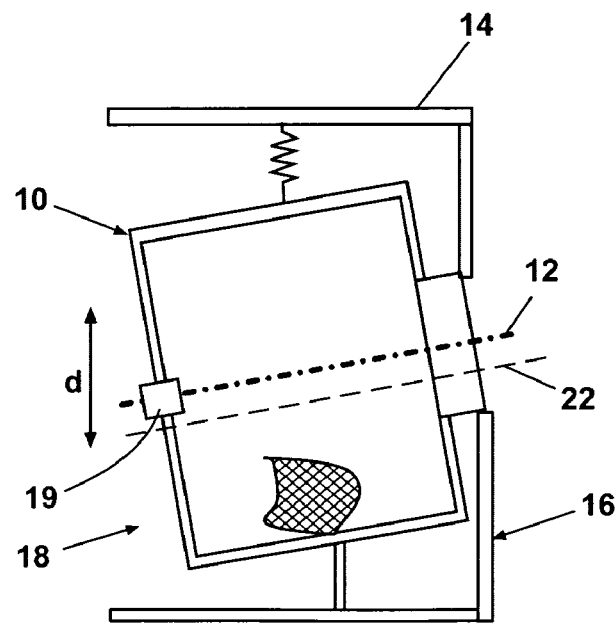

During a spin cycle where water is extracted from clothes in the drum by centrifugal force, the drum 102 is accelerated to rotate at relatively high speeds, on the order of 1100 RPM. If the load in the drum 102 is unevenly distributed in a manner to create a static imbalance as in FIG. 1(a) and (b) the drum will oscillate about its geometric axis. Such oscillation can be detected early in the spin cycle at low speed using known methods, e.g., the method disclosed in the '372 patent. If the oscillation exceeds a predetermined threshold, the machine can be slowed or stopped to correct the imbalance. This is an infrequent problem in horizontal axis machines, however, because the load tends to balance itself about the geometric axis during acceleration of the basket 104.

Figure 2A:
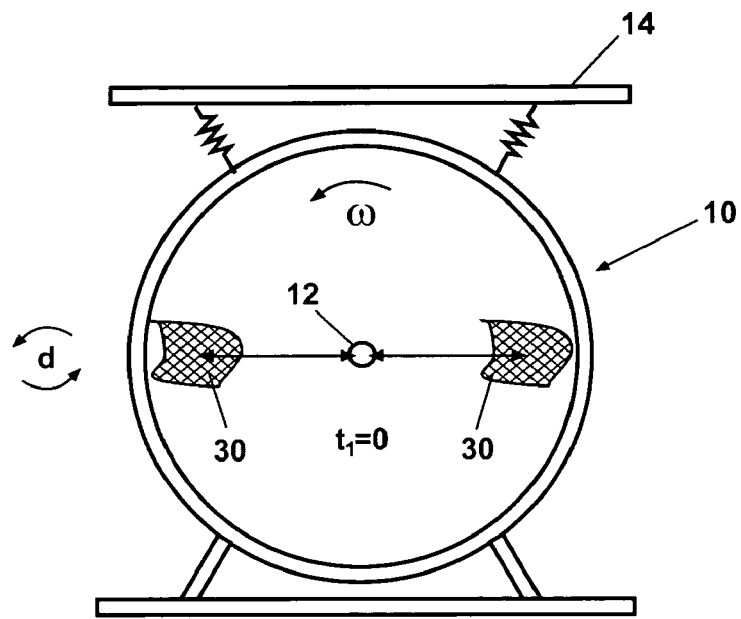
FIGS. 2(a) and (b) is a schematic illustration of the concept of dynamic imbalance caused by a dynamic off balance load.
Figure 2B:
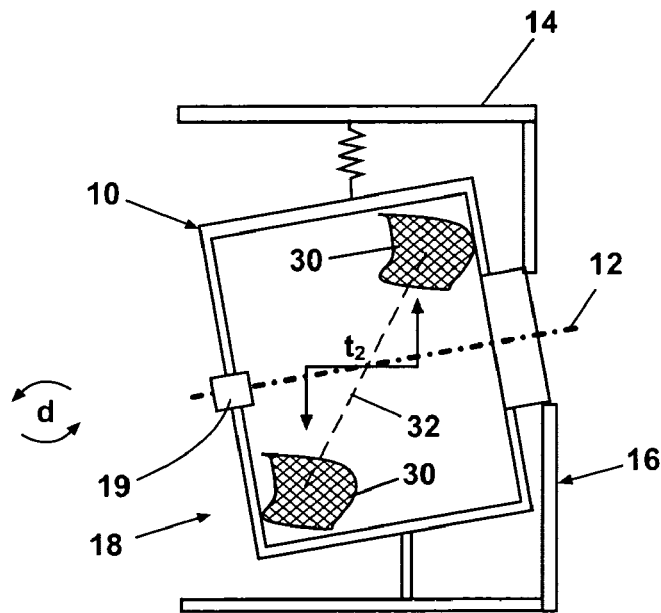
Figure 3A:
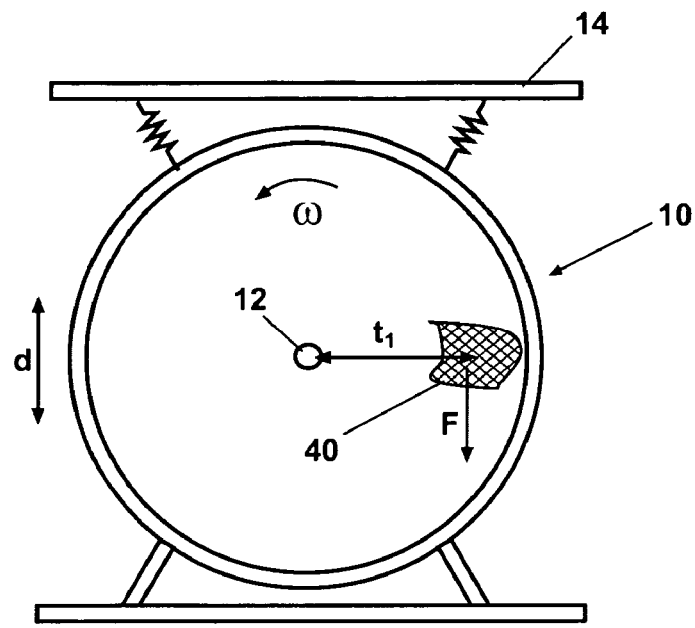
FIGS. 3(a) and (b) is a schematic illustration of the concept of dynamic imbalance caused by a front off balance load.
Figure 3B:
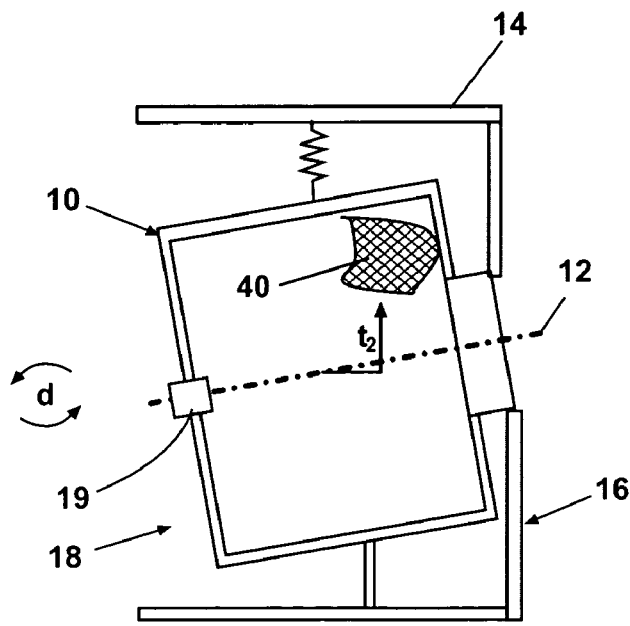
Figure 4A:
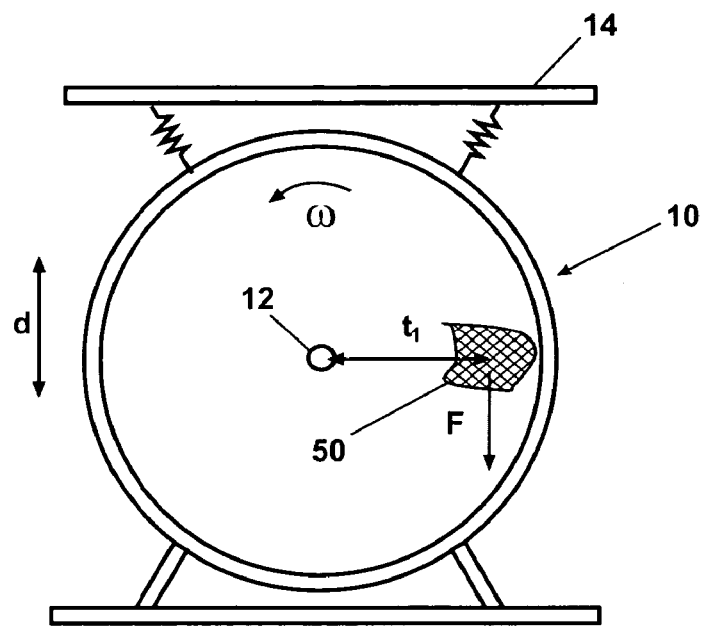
FIGS. 4(a) and (b) is a schematic illustration of the concept of dynamic imbalance caused by a back off balance load.
Figure 4B:
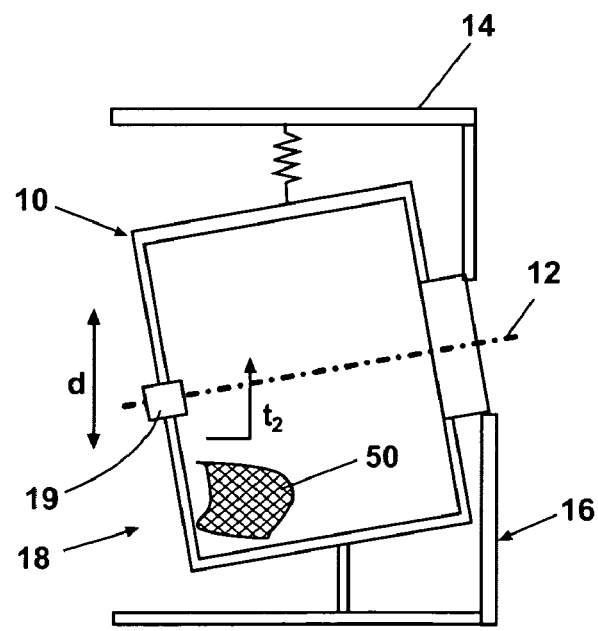
Figure 5A:
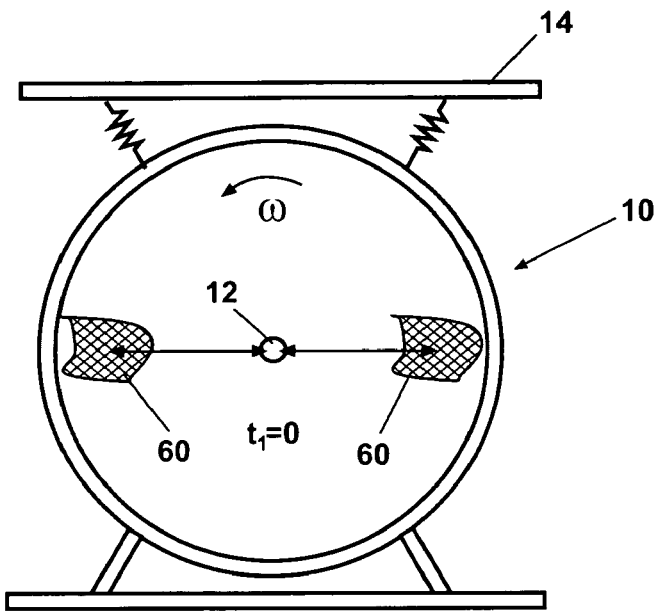
FIGS. 5(a) and (b) is a schematic illustration of the concept of a point distribution condition.
Figure 5B:
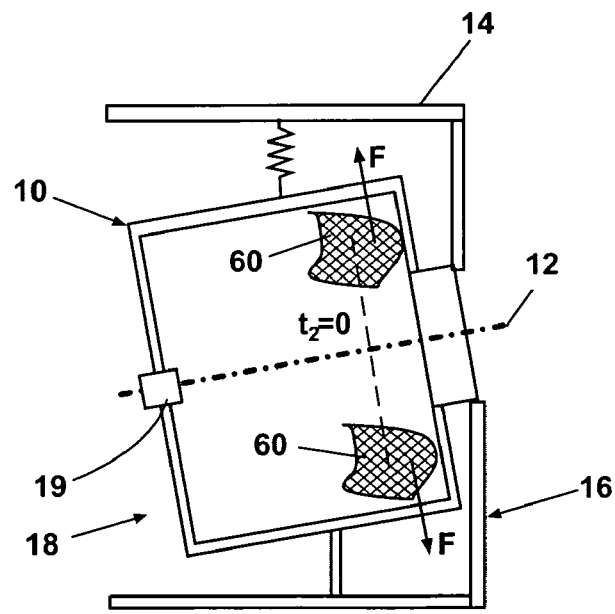

Nevertheless, regardless of distribution of the load about the geometric axis, it is not unusual for the load to be distributed unevenly from one end of the drum 102 to the other, creating a dynamic imbalance as in FIGS. 2–4. Unlike static imbalance in a horizontal axis washer, a dynamic imbalance is not self-correcting and does not normally appear until higher speeds are achieved. If the imbalance is large enough and remains uncorrected, the resulting vibration, noise, and attendant risks are manifest. Also in larger capacity washers that can hold up to 10 Kg of mass, there is a risk that the basket will deform and touch the tub as the basket spins at high speed (see FIG. 5). The earlier an imbalance condition or a potential tub deformation can be detected, the earlier corrective action can be applied consistent with effective performance, and without significantly sacrificing speed.

Accordingly, the present invention as illustrated in FIGS. 7–14 provides a method for detecting a dynamic imbalance early enough to effectively avoid unacceptable vibration conditions and optimize rotational speed for any given load.

Figure 7:
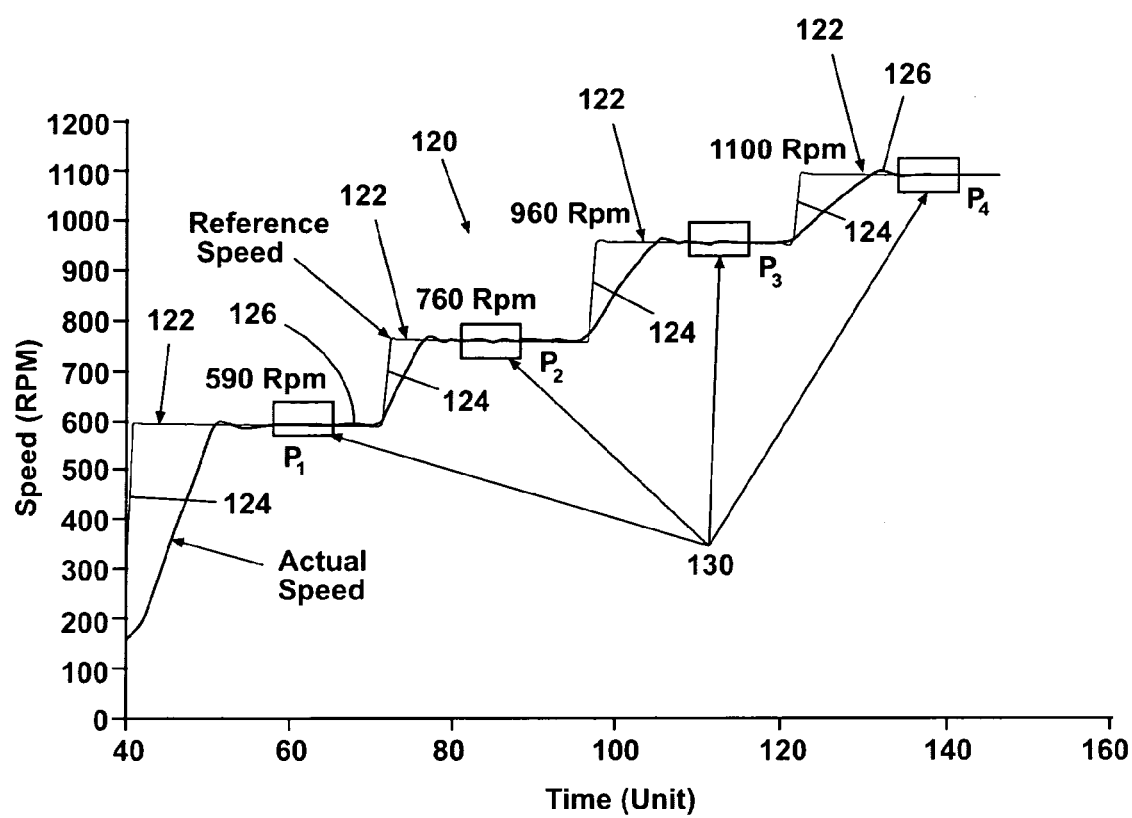
FIG. 7 is a graphic illustration of a speed profile and sampling windows according to the invention.
Figure 8:
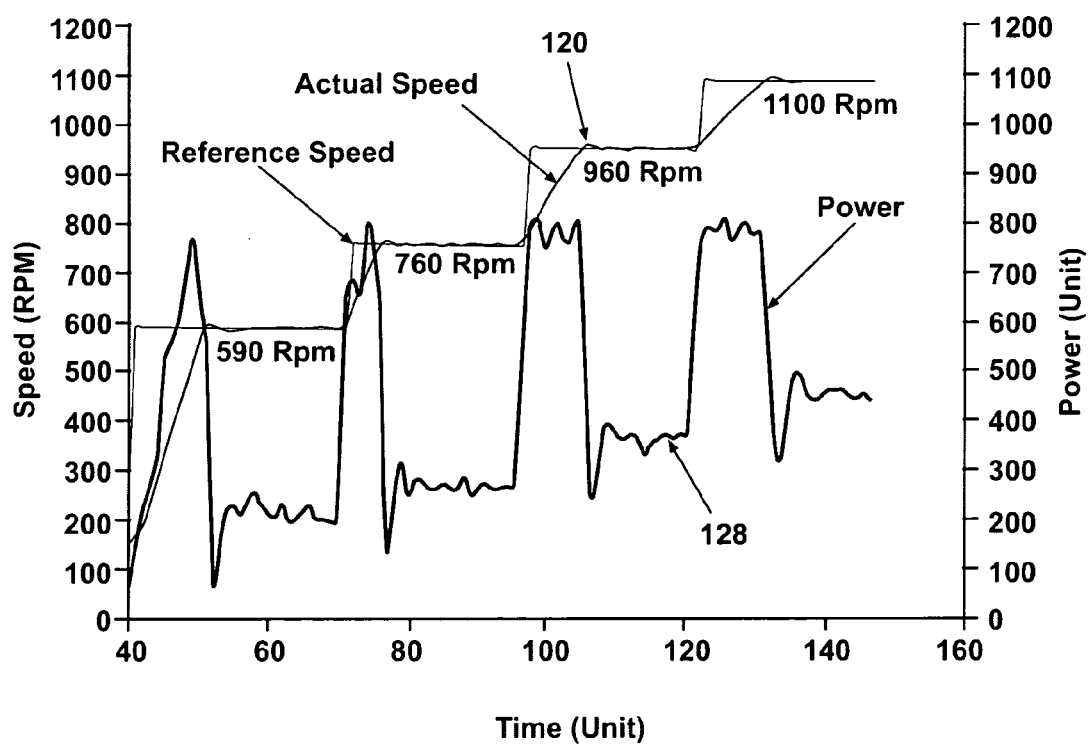
FIG. 8 is a graphic illustration of a power profile superimposed on the speed profile of FIG. 7 in a balanced condition.

A predetermined speed profile 120 is established as shown in FIG. 7. The speed profile 120 is characterized by a series of steps 122, each step having a speed ramp 124 and a speed plateau 126. For the present embodiment, speed step 1 has a reference speed of 590 RPM, speed step 2 is 760 RPM, speed step 3 is 960 RPM and speed step 4 is the design speed of 1100 RPM for the spin cycle. Each speed ramp 124 is a dynamic period where the drum speed accelerates from a lower speed step to a higher speed step, and where the motor has to deliver a higher power (or torque) to accelerate the drum. Each speed plateau 126 is a static period where the drum achieves a constant speed, and where the motor must deliver only enough power to overcome system friction or drag and torque caused by an imbalance. Actual speed will generally follow the reference speed as the motor drives the drum, when the motor is controlled by a controller (not shown). FIG. 8 shows a sample power profile 128 superimposed on the speed profile 120 with a balanced load.

In general, a washing machine can be considered a rigid body that is not an energy sink. Thus, the amount of energy absorbed by the machine's suspension system in passive mode is limited. When the energy absorbed by the suspension exceeds a threshold value, the excess energy will dissipate as vibration, noise and heat. In this case, the washer will behave abnormally. Thus, tracking the power profile 128 related to the speed profile 120 can indirectly monitor imbalance conditions in the washing machine 100.

In this invention, an algorithm has been developed for monitoring real-time power. The power input information is calculated from the DC bus voltage and DC bus current of the motor control inverter (see the discussion below). A micro-controller or DSP is utilized to handle this signal processing. A variable speed motor control system drives the drum to track the reference speed profile in a closed loop status. A filtering technique is provided to reduce any noise impacts in signal processing (see below).

Looking again at FIG. 7, the speed profile 120 has four speed steps 122 to reach the design spin speed. Each speed step 122 has a sampling window 130 defined over time, preferably during the speed plateau 126. Preferably, the starting time for each sampling window 130 is determined empirically for a given machine by running a maximum rated load for the machine over the speed profile 120 and ascertaining when the power profile 128 achieves stability after completion of the ramp up for each speed step. The sampling rate and total samples taken are preferably the same for all sampling windows. An average power level k can be calculated by $$P_k = \frac{\sum_{i=1}^{n} p_{ki}}{n}$$

where k=1, 2, 3, 4 for each respective sampling window, $P_{ki}$=instantaneous power reading; and n=total sampling numbers.

Thus, four power samples $P_1$, $P_2$, $P_3$, and $P_4$ as shown in FIG. 7 can be obtained during the spin cycle. Each power sample can be considered to have two parts. One part is the power for overcoming the system friction and drag. The other part is the power needed to overcome imbalance, whether static or dynamic. Although there is some interaction between the two parts, a distinction is a reasonable assumption in this case. The system friction and drag differs from washer to washer. But an imbalance condition differs from load to load in a given washer. The method according to the invention is robust enough to accommodate the variations in both parts.

Figure 9:
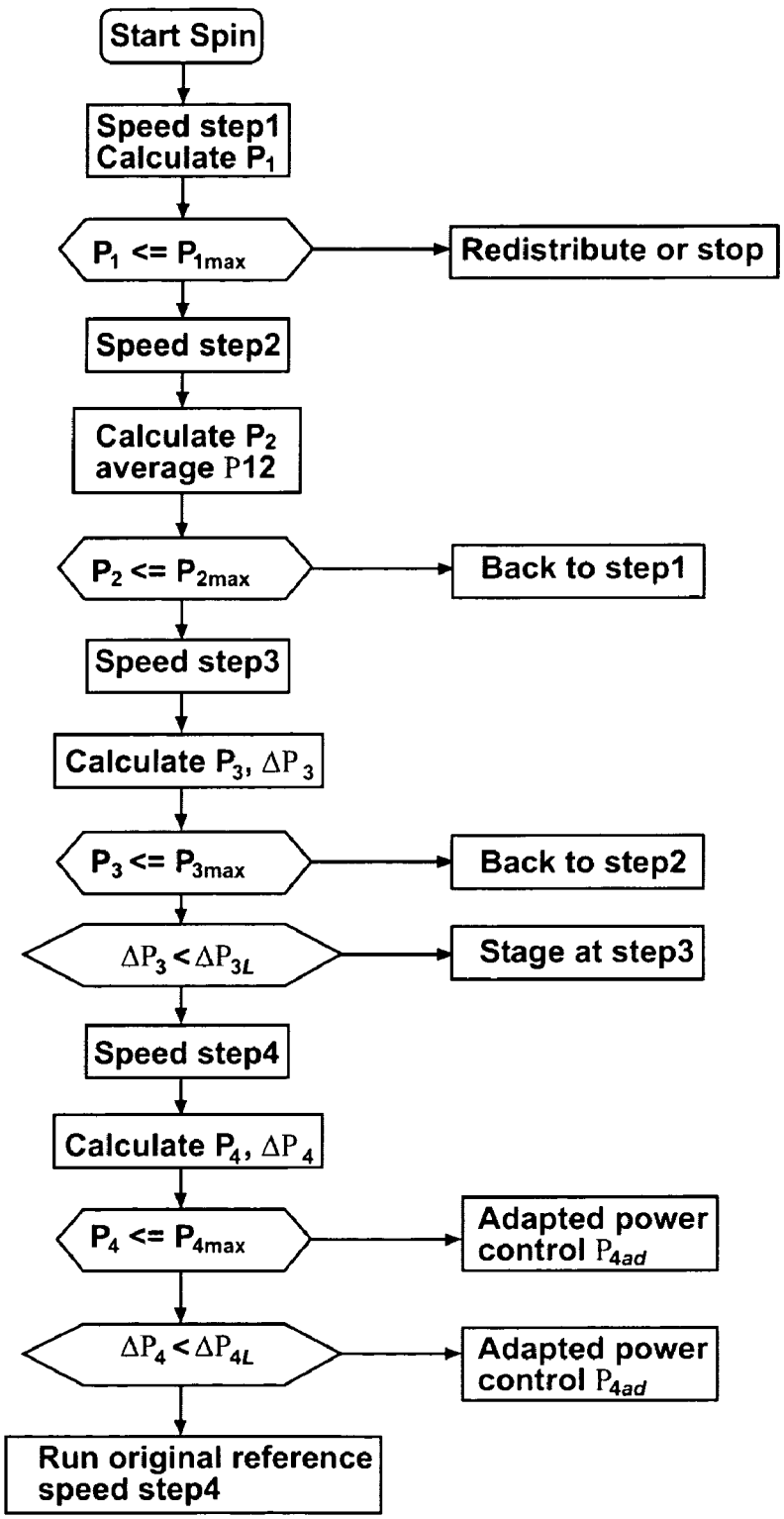
FIG. 9 is a flow diagram schematically illustrating a method for detecting unbalance conditions according to the invention.

Looking now at FIG. 9, the inventive method will be described in greater detail. As mentioned, a speed profile for a given washing machine is predetermined. In addition, a maximum acceptable power, $P_{1max}$, $P_{2max}$, $P_{3max}$, $P_{4max}$, is predetermined for each speed step 122. These values are defined as the power at which the effects of imbalance for the washer are unacceptable and are determined empirically for the given model of washer. The method contemplates using two factors for ascertaining dynamic imbalance conditions: maximum power and incremental power. Moreover, it is assumed that there is an acceptable range of imbalance conditions (below $P_{max}$) before corrective action must be taken. For imbalance conditions in an acceptable range, sampling at speed steps 1 and 2 will not trigger large effects of an unbalanced load (absent unacceptable static imbalance over $P_{max}$). However, speed steps 3 and 4 will result in large effects. Thus, according to the method, the speed steps 3 and 4 are the steps to be carefully monitored for detecting abnormal dynamic conditions. Incremental power $\Delta P_3$ is the power needed to increase drum rotation from speed step 2 to speed step 3 and $\Delta P_4$ is the power needed to increase drum rotation from speed step 3 to speed step 4. Just as maximum power is determined empirically for each speed step, threshold incremental powers $\Delta P_{3L}$ and $\Delta P_{4L}$ are empirically determined for the incremental increases from speed steps 2 to 3 and 3 to 4, respectively.

As the washing machine begins its spin cycle and after the drum 102 accelerates to the first speed step, $P_1$ is calculated at the first sampling window. $P_1$ is compared to $P_{1max}$ to determine whether an unacceptable imbalance condition exists. If $P_1$ is not less than $P_{1max}$ then the controller takes action to correct. Since at this low speed, any detected imbalance is more likely to be a static imbalance, the corrective action is most likely to be redistribution of the load (e.g., stopping the spin cycle to permit manually rearrange the clothes load, or automatically reordering the spin direction and speed.). If $P_1$ is less than $P_{1max}$ then the controller takes the spin cycle to the next speed step 2.

Here the incremental factor begins. $P_2$ is calculated at the second sampling window, and $P_1$ and $P_2$ are averaged as $$\overline{P}_{12} = \frac{P_1 + P_2}{2}$$

to determine an average power $\overline{P}_{12}$, which becomes a base power value for later calculations. For different system frictions, this value will be different. Meanwhile a comparison is made between $P_2$ and $P_{2max}$ just in case an imbalance condition first appears in speed step 2. If $P_2$ is not less than $P_{2max}$ then the control reduces the drum rotation to speed step 1, which is reprocessed. If $P_2$ is less than $P_{2max}$ then the controller takes the spin cycle to the next speed step 3.

When the drum rotation reaches speed step 3, the effect of any dynamic imbalance may begin to appear. $P_3$ is calculated at the third sampling window, and the incremental power increase from step 2 to step 3 is calculated as $\Delta P_3$, using the formula $\Delta P_3 = P_3 - \overline{P}_{12}$. A conventional comparison of $P_3$ to $P_{3max}$ is made, as was done earlier for speed steps 1 and 2. In addition, the incremental power $\Delta P_3$ is compared to the threshold incremental power for speed step 3, $\Delta P_{3L}$, to ascertain whether a dynamic imbalance condition may appear at higher speeds. If $\Delta P_3$ is less than $\Delta P_{3L}$, then the controller takes the spin cycle to the next speed step 4. If, however, $\Delta P_3$ is greater than $\Delta P_{3L}$, then the drum rotation stays at speed step 3 for the remaining spin cycle. The controller may be programmed to alter the time at which the drum spins consistent with the lower rotation speed.

When the drum rotation reaches speed step 4, $P_4$ is calculated at the fourth sampling window, and the incremental power increase from step 3 to step 4 is calculated as $\Delta P_4$, using the formula $\Delta P_4 = P_4 - \overline{P}_{12}$. A conventional comparison of $P_4$ to $P_{4max}$ is made, as was done earlier for speed steps 1–3. In addition, the incremental power $\Delta P_4$ is compared to the threshold incremental power for speed step 4, $\Delta P_{4L}$, to ascertain whether a dynamic imbalance exists. If $\Delta P_4$ is less than $\Delta P_{4L}$, then the controller maintains the spin cycle at the reference speed for speed step 4. If, however, $\Delta P_4$ is greater than $\Delta P_{4L}$, then the controller will cause drum rotation to slow to speed step 3 or some other speed for the remaining spin cycle. The controller may be programmed to alter the time at which the drum spins consistent with the lower rotation speed.

Figure 10:
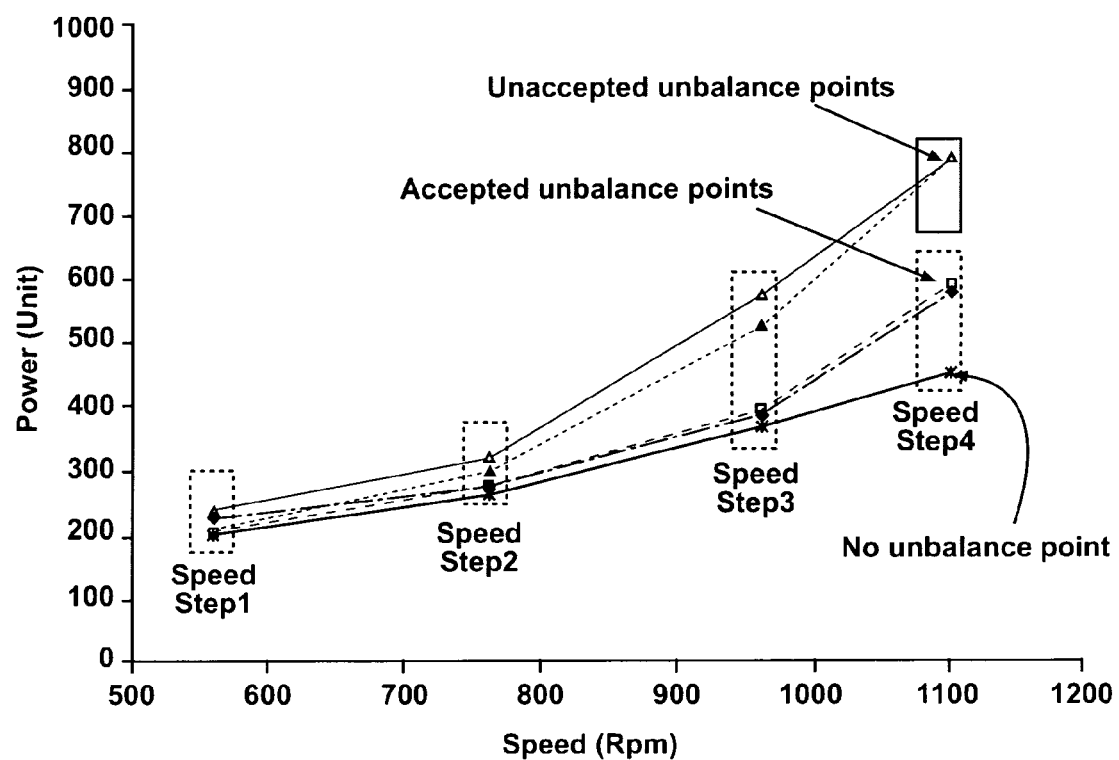
FIG. 10 is a graphic illustration of power v. speed for four unbalanced loads and a balanced load after application of the method according to the invention.
Figure 11:
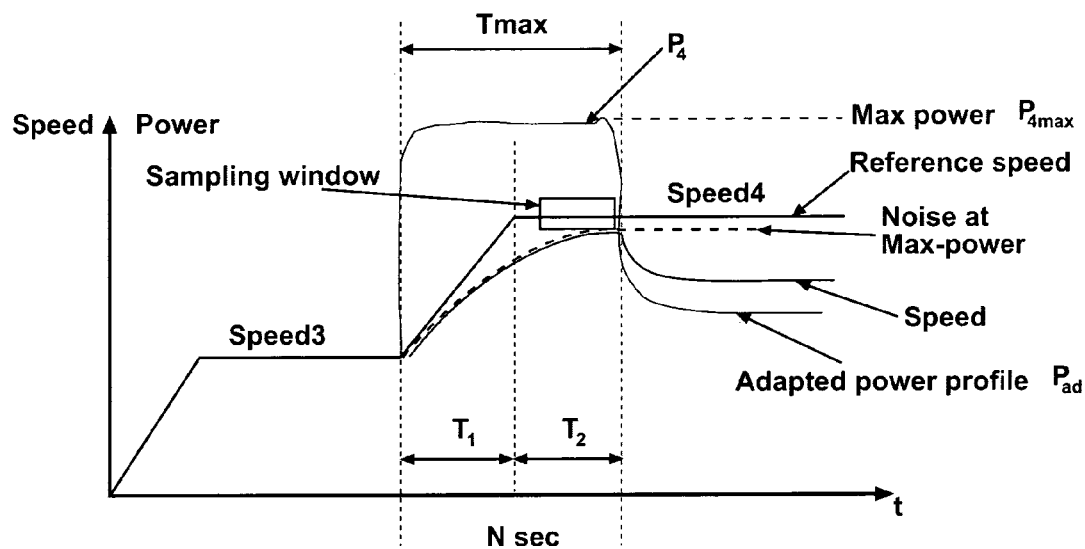
FIG. 11 is a graphic illustration similar to FIG. 7 showing the fourth speed step and adapted speed and power after corrective action for an unbalanced load.

FIG. 10 illustrates a sample power level plot for five different loads taken through spin cycles in a single washing machine utilizing the method according to the invention, each load represented by a separate line and separate sampling points at each speed step. In addition, the dotted boxes represent ranges of acceptable power outputs for each speed step after application of the inventive method, consistent with acceptable balance conditions at each speed step. At speed steps 1 and 2, the effect of load imbalances does not show up significantly. At speed step 3, there is a big difference between small and large imbalances, but they are still within the acceptable range. When the drum rotation reaches speed step 4, some load imbalances are within the acceptable range. However, some of the load imbalances now exceed the range, and the controller must take corrective action to reduce vibration and noise, e.g. simply reducing rotation speed to a predetermined level.

The method contemplates another speed adaptive control option called power control spinning. This option is graphically illustrated in FIG. 11. When the rotational speed accelerates to speed step 4 from speed step 3, a large power (or torque) is needed during the dynamic period T1. After T1, the speed should reach the reference speed, if without an imbalance. When there is a large power $P_4$ after sampling (during T2), an unacceptable imbalance condition occurs. The controller will take action. An adaptive power reference will be defined by power average $\overline{P}_{12}$ and the incremental power $\Delta P_{4L}$. The motor controller drives the washer to track an adapted power profile $P_{4ad}$. The drum speed is reduced to a proper speed. It is possible that a dynamic imbalance will self-correct, e.g. after water is extracted, whereupon the controller can increase speed again.

Either of these two options for adaptive speed control can limit any unexpected operation to exist in a certain limited time. For example; in extreme conditions, the steel basket 104 could be stretched to touch the tub 106. If that were to occur, the power output will reach the maximum or ceiling value because of the large drag torque. In response, the controller can take action in N seconds to reduce the speed to a proper level. The time $T_{max}$ is the maximum running time when any unexpected operation could occur. Therefore, the controller can effectively monitor the washer operation status, predict and avoid performance problems before an imbalance condition causes severe degradation of performance or machine.

Figure 12:
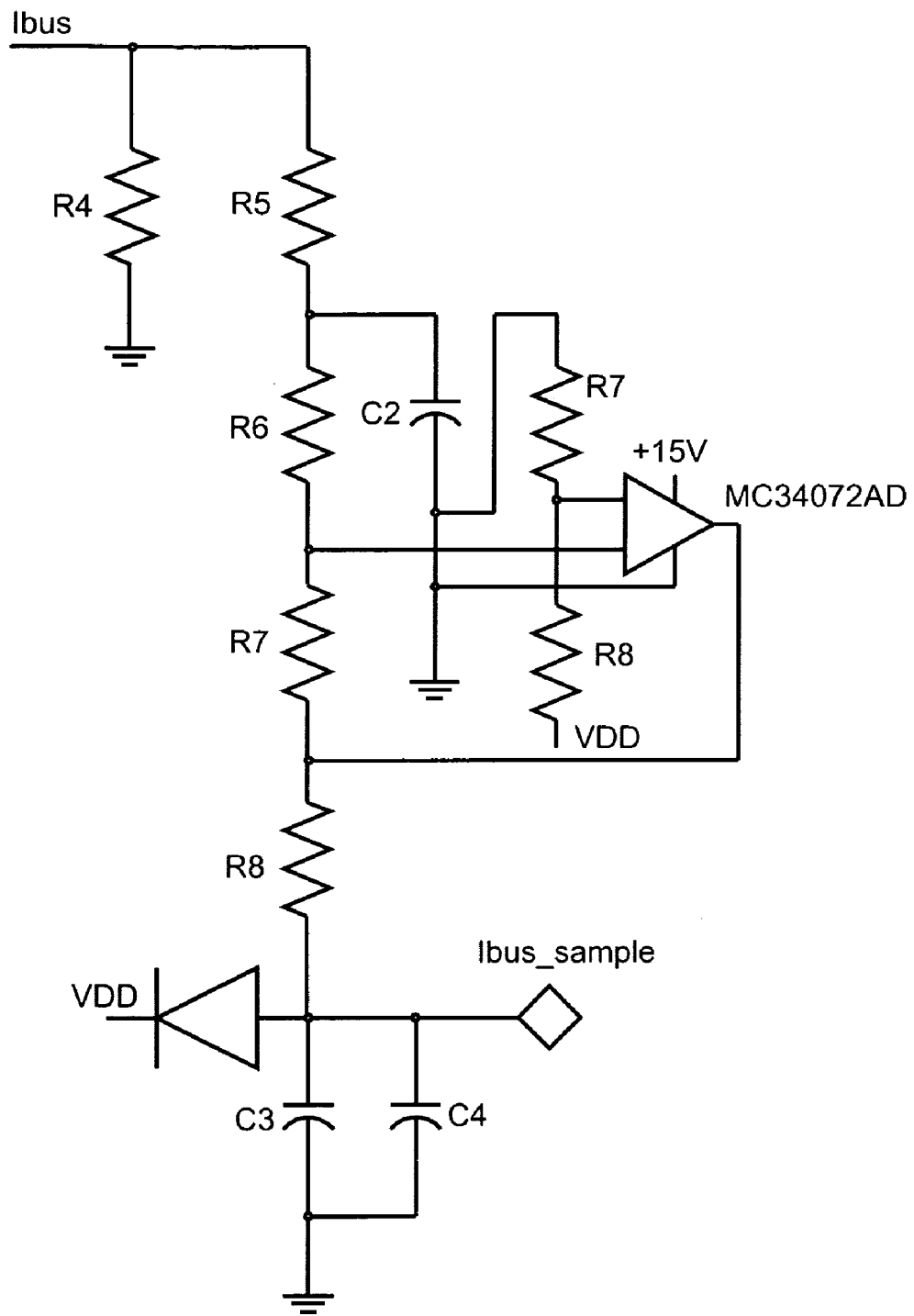
FIG. 12 schematically shows a circuit for measuring DC bus voltage of a motor control inverter according to the invention.
Figure 13:
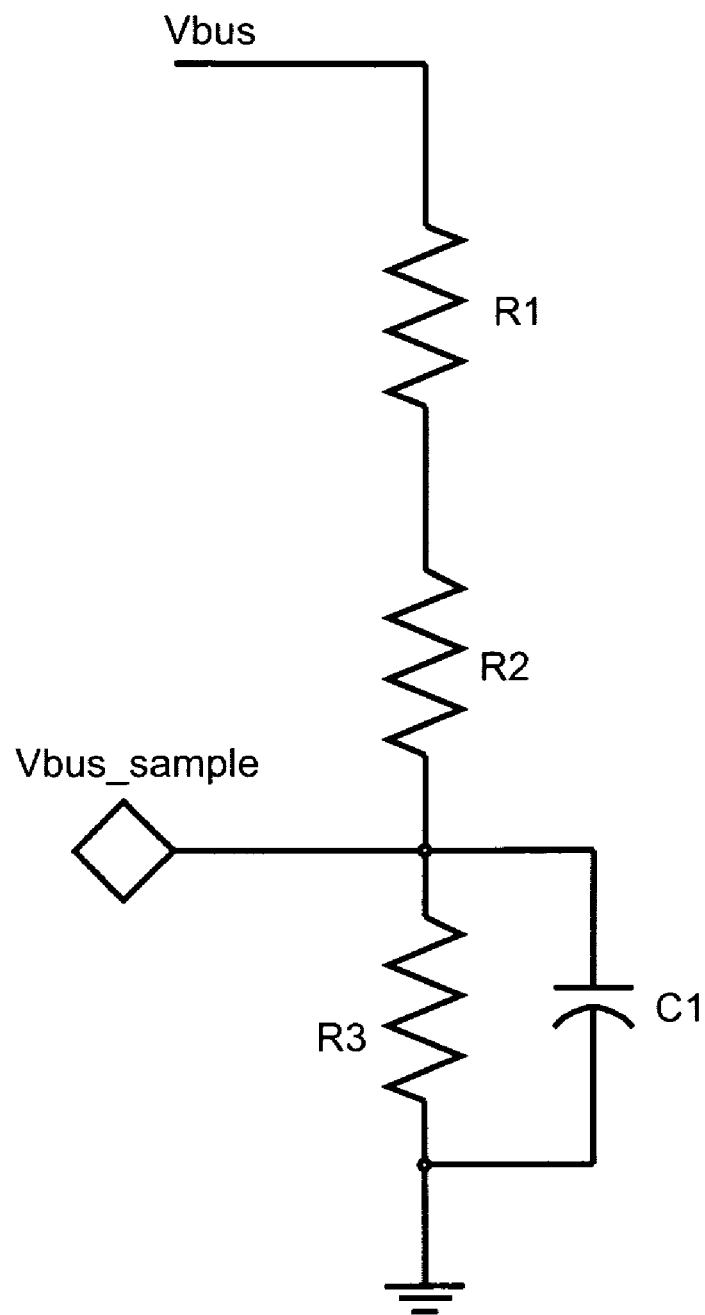
FIG. 13 schematically shows a circuit for measuring DC bus current of a motor control inverter according to the invention.
Figure 14:
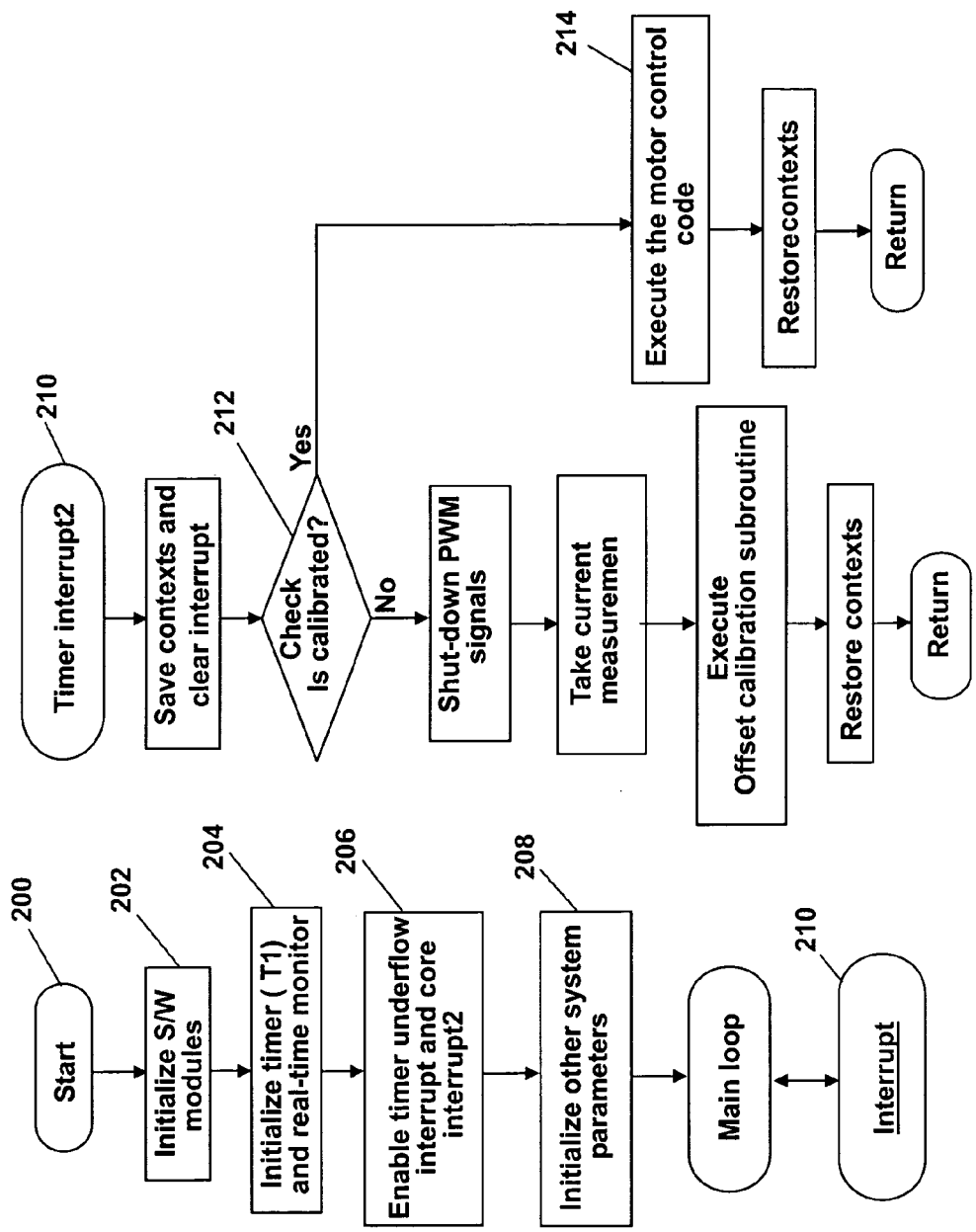
FIG. 14 is a flow chart illustrating an offset calibration method according to the invention.

While any manner of detecting power output from the motor may provide useful data for the foregoing method, it is preferable to ensure stable and robust power information. FIGS. 12–14 illustrate a calibration process for removing the offset due to parameter variations in motors and controller hardware boards. A filtering process is also provided for removing bad data points in real time, based on an appropriate sampling rate range for power calculation using voltage and current measurements at the motor inverter.

Calibration

According to the invention, power P for detecting the effects of unbalance loads for the foregoing method is calculated on the basis of the DC bus voltage ($V_{dc}$) and DC bus current ($I_{dc}$) of the motor control inverter. The DSP preferably samples $V_{dc}$ and $I_{dc}$ simultaneously at a sampling rate of once every 50 microseconds or 20,000 times per second (20 KHz). In general, the sampling rate can be in a range of 20 to 50 KHz. FIGS. 12 and 13 show exemplary DC bus voltage and DC bus current sensing circuits. It will be apparent that the components of the sensing circuits, such as resistors, may vary from one controller to another, resulting in an offset when measuring $I_{dc}$ from a given controller. Consequently, the power calculation of P may not be accurate from one controller to another. In practice, current offsets in measurements are unavoidable. As a result, some self-calibration for current offset is necessary for an accurate power calculation.

Initial offset calibration occurs by automatically detecting both $V_{dc}$ and $I_{dc}$ as soon as the controller is powered on, determining the offset, and then making an adjustment to remove the offset. Detection at the normal sampling rate of 20–50 KHz occurs during initialization of the motor controller where the induction motor is not driven (PWM is shut down), and DC bus voltage is set up. At the time of initialization, measured current represents the current offset. The current offset is thus measured at each sample and averaged over a variable number of times, preferably 216–512 (generally enough for accuracy). Preferably, a default value is n=512. Averaging occurs as follows:

$$i_{\textit{off-set}} = \frac{i^1 + i^2 + \cdots + i^n}{n}$$

After averaging the measured current (offset current) n times, a calibration value is calculated that, if applied to a sampled current when the motor is running, will result in a zero offset. Thereafter, in the calculations of power P based on sampled current and voltage as shown in FIG. 9, the calibration value is used to compensate for offsets. Referring now to FIG. 14, the flow of steps in the calibration according to the invention can be seen. Upon startup 200 of the motor controller, regardless of architecture, normal initialization occurs, e.g. initializing S/W modules, timers and other system parameters (202, 204, 206, 208). When the system reaches a predetermined interrupt 210, contexts are saved and interrupt flags are cleared. Then at 212 the system queries whether or not calibration has occurred. If not, then a loop commences where PWM signals are shutdown so that the motor does not start, and current sampling commences at the predetermined sampling rate (20–50 KHz). Offset values are calculated in accord with the running average $i_{\textit{off-set}}$ until the number of samples reaches n (preferably 216–512), at which time the calibration is complete and the flag for the query at 212 is set to true. At that point, the motor control scheme 214 will be started. It is during the motor control scheme that measurements of power P (adjusted for the offsets) in FIG. 9 occur.

Filtering

Noise is always a component of sampling signals received from the DC bus voltage and current circuits. Accuracy of power calculations can be enhanced by filtering data points affected by noise spikes. Such signals will have a sharp transition among sampling values. An adaptive moving window average filter according to the invention filters out such bad data points and is described herein.

Suppose that at any instant k, the power average of the last n (for example, 256 points) samples of a data sequence is given by:

$$\overline{p_k} = \frac{1}{n}\sum_{i=k-n+1}^{k} p_i.$$

Similarly, at the previous time instant, k−1, the power average of the last n samples is:

$$\overline{p_{k-1}} = \frac{1}{n}\sum_{i=k-n}^{k-1} p_i$$

Therefore, $$\overline{p_k} - \overline{p_{k-1}} = \frac{1}{n}\left(\sum_{i=k-n+1}^{k} p_i - \sum_{i=k-n}^{k-1} p_i\right) = \frac{1}{n}(p_k - p_{k-n}),$$

which can be expressed as:

$$\overline{p_k} = \overline{p_{k-1}} + \frac{1}{n}(p_k - p_{k-n})$$

Thus, at any instant, a moving window of n values is used to calculate the power average of the data sequence. Three values can thus be continuously calculated for the moving window: $\overline{p_k}$, $\overline{p_{k-1}}$, and $\overline{p_{k+1}}$. Furthermore, errors among the three power average values can be calculated compared continuously, as follows:

$$e_{k+1} = \overline{p_{k+1}} - \overline{p_k}$$

$$e_k = \overline{p_k} - \overline{p_{k-1}}$$

$$e_{k-1} = \overline{p_{k+1}} - \overline{p_{k-1}}$$

A running comparison of errors will identify which errors are large enough to be over a pre-set limit. In such case the associated sample that resulted in the large error should be treated as a bad point and will be discarded in the sense that the sample is not used and is no longer available for further processing. Thus, higher accuracy and stability are achieved. In the illustrated embodiments, discarding a bad sample means that neither the given current and voltage samples, nor the resultant power calculation is used in the imbalance detection routine of FIG. 9, nor is it used in the calibration method according to the invention, nor is it used further in establishing the moving window of the filtering process.

While the invention has been specifically described in connection with certain specific embodiments thereof, it is to be understood that this is by way of illustration and not of limitation, and the scope of the appended claims should be construed as broadly as the prior art will permit.

What is claimed is:

1. A method of calibrating current offsets from a direct current bus circuit used by a controller to control a motor comprising:

initializing the direct current bus circuit, disengaging pulse width modulated signals to the motor, sampling current values at a predetermined sampling rate, averaging the current values over a predetermined number of samples to establish an offset value, and calculating a calibration value, whereby the controller uses the calibration value to nullify the offset value while processing current samples for controlling the motor.

2. The method of claim 1 wherein the sampling rate is in a range of 20–50 KHz.

3. The method of claim 2 wherein the sampling rate is 20 KHz.

4. The method of claim 1 wherein the predetermined number of samples is in a range of about 200–512.

5. The method of claim 4 wherein the predetermined number of samples is 512.

6. A method of filtering inaccurate data from a sequential calculation of power values by a controller based on repeatedly sampled voltage and current of a motor obtained at a predetermined sampling rate, comprising:

establishing a moving window of a predetermined number of power values that moves to include the power value based on the last sample of voltage and current, calculating an average power over a sequence comprising the predetermined number of power values at three different times within the window, calculating an error value for each time, based on the difference between two of the average power values, and comparing each error value to a preset value, whereby the controller uses the power value to control the motor unless the error value exceeds the preset value.

7. The method of claim 6 wherein the predetermined sampling rate is in a range of 20–50 KHz.

8. The method of claim 6 wherein the predetermined number of power values is about 256.

9. The method of claim 1 wherein the controller and motor are used in a washing machine.

10. The method of claim 6 wherein the controller and motor are used in a washing machine.

* * * * *